United States Patent
Chao et al.

(10) Patent No.: US 8,723,263 B2
(45) Date of Patent: May 13, 2014

(54) ELECTROSTATIC DISCHARGE PROTECTION DEVICE

(75) Inventors: Mei-Ling Chao, Hsinchu (TW);
Yi-Chun Chen, Pingtung County (TW);
Lu-An Chen, Keelung (TW);
Tai-Hsiang Lai, Hsinchu (TW);
Tien-Hao Tang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/556,219

(22) Filed: Jul. 24, 2012

(65) Prior Publication Data
US 2014/0027856 A1 Jan. 30, 2014

(51) Int. Cl.
*H01L 23/62* (2006.01)
(52) U.S. Cl.
USPC ............................ 257/355; 257/356; 257/360
(58) Field of Classification Search
USPC ......................... 257/355, 356, 360
See application file for complete search history.

(56) References Cited

U.S. PATENT DOCUMENTS

| | | |
|---|---|---|
| 5,637,900 A | 6/1997 | Ker |
| 5,959,820 A | 9/1999 | Ker |
| 6,724,677 B1 | 4/2004 | Su |
| 6,909,149 B2 | 6/2005 | Russ |
| 6,989,572 B2 | 1/2006 | Stefanov |
| 7,009,252 B2 | 3/2006 | Lin |
| 7,027,276 B2 | 4/2006 | Chen |
| 7,205,612 B2 | 4/2007 | Cai |
| 7,368,761 B1 * | 5/2008 | Lai et al. ................. 257/173 |
| 7,672,100 B2 | 3/2010 | Van Camp |
| 7,910,998 B2 | 3/2011 | Hwang |
| 2003/0076636 A1 | 4/2003 | Ker |
| 2006/0267102 A1 | 11/2006 | Cheng |
| 2011/0309443 A1 * | 12/2011 | Huang et al. ............ 257/343 |
| 2012/0119331 A1 * | 5/2012 | Gendron et al. ......... 257/587 |

* cited by examiner

*Primary Examiner* — Tan N Tran
(74) *Attorney, Agent, or Firm* — Winston Hsu; Scott Margo

(57) ABSTRACT

An electrostatic discharge (ESD) includes a semiconductor substrate having the first conductive type, a well having the first conductive type, a buried layer having the second conductive type and a well having the second conductive type. The buried layer having a second conductive type is disposed in the semiconductor substrate under the well having the first conductive type. The well having the second conductive type disposed to divide the well having the first conductive type into a first well and a second well. The well having the second conductive type contacts the buried layer, and the well having the second conductive type and the buried layer are jointly used to isolate the first well from the second well.

14 Claims, 4 Drawing Sheets

ELECTROSTATIC DISCHARGE PROTECTION DEVICE

BACKGROUND OF THE INVENTION

1. Field of the Invention

The present invention relates to an electrostatic discharge (ESD) protection device, and more particularly, to an ESD protection device having a path for discharging electrostatic current along a vertical direction.

2. Description of the Prior Art

Electrostatic discharge (ESD) represents one of the main threats to reliability in semiconductor products, especially in scaled-down CMOS technologies. Due to low breakdown voltage of thinner gate oxide in deep-submicron CMOS technologies, an efficient ESD protection circuit must be designed and placed on every input pad to clamp the overstress voltage across the gate oxide of the internal circuit. The ESD endurance of the ESD protection circuit generally needs to endure higher than 2 kV in the human-body-model (HBM) ESD stress, and higher than 200V in the mechanical-model (MM) ESD stress.

To prevent electrostatic breakdown caused by electrostatic pulses, metal-oxide-semiconductor field effect transistors (MOSFET) are used in the conventional ESD protection devices. Please refer to FIG. 1, FIG. 1 is a schematic diagram illustrating a conventional electrostatic discharge (ESD) protection circuit used to protect an internal circuit. As shown in FIG. 1, the ESD protection circuit 10 is connected to the input/output (I/O) pad 12 and the internal circuit 14, and the I/O pad 12 is used as a transfer medium between the internal circuit 14 and external electronic signals. When static electricity 11 discharges through the I/O pad 12, the ESD protection circuit 10 can protect the internal circuit 14 from excess electrostatic currents that could burn out the internal circuit 14. Generally, the ESD protection circuit 10 may at least include a P-type metal-oxide-semiconductor (PMOS) 16 and an N-type metal-oxide semiconductor (NMOS) 18. The drains D of the PMOS 16 and NMOS 18 are tied together and connected to the internal circuit 14 and the I/O pad 12 by a conducting wire 20. The source S of the PMOS 16 is connected to the gate G of the PMOS 16 and a power terminal VDD. The source S of the NMOS 18 is connected to the gate G of the NMOS 18 and a grounding terminal VSS. Furthermore, a first parasitic diode 22 is formed at the PMOS 16, and a second parasitic diode 24 is formed at the NMOS 18.

When static electricity discharges through any two points of the power terminal VDD, the I/O pad 12 and the grounding terminal VSS, the generated electrostatic currents is instantly discharged by the activation of the first parasitic diode 22, the activation of the second parasitic diode 24, snapback breakdown generated by the PMOS 16, or snapback breakdown generated by the NMOS 18. For example, when a foreign object simultaneously touches the power terminal VDD and the I/O pad 12, and makes the electric potential of the I/O pad 12 higher than the electric potential of the power terminal VDD, the first parasitic diode 22 will be turned on to instantly discharge electrostatic currents. Likewise, when a foreign object simultaneously touches the I/O pad 12 and the grounding terminal VSS, and makes the electric potential of the I/O pad 12 higher than the electric potential of the grounding terminal VSS, the NMOS 18 will generate snapback breakdown to instantly discharge electrostatic currents.

The channel region of the NMOS 18 has a structure with a small shallow junction depth, therefore, when a large electrostatic current (typically 1.33 ampere (Amp) for a 2 kV HMB ESD event) flows through the very shallow channel region of the NMOS 18, the NMOS 18 is often burned out even if the NMOS 18 has a large device dimension, and the ESD protection circuit 10 would be disabled. Accordingly, how to improve the structure of the ESD protection devices used in the ESD protection circuits is still an important issue in this field.

SUMMARY OF THE INVENTION

It is therefore one of the objectives of the present invention to provide an electrostatic discharge (ESD) protection device to improve ESD endurance of the ESD protection circuit.

According to one exemplary embodiment of the present invention, an ESD protection device is provided. The ESD protection device includes a semiconductor substrate having the first conductive type, a well having the first conductive type, a buried layer having the second conductive type and a well having the second conductive type. The well having the first conductive type is disposed in a semiconductor substrate, and the buried layer is disposed in the semiconductor substrate under the well having the first conductive type. The well having the second conductive type is disposed to divide the well having the first conductive type into a first well and a second well. The well having the second conductive type contacts the buried layer, and the well having the second conductive type and the buried layer are jointly used to isolate the first well from the second well.

In the present invention, the second well is disposed under the doped region which may serve as a drain, and the electrostatic current can be discharged through the drain doped region, the second well and the buried layer along the vertical direction. In other words, the electrostatic current could be discharged not only through the channel region along the horizontal direction, but also through the second well and the buried layer along the vertical direction. Accordingly, the discharging path of electrostatic current can be increased, the excess heat caused by electrostatic current can be prevented from burning out the ESD protection device, and the ESD endurance of the ESD protection device is increased. Moreover, the second well is formed by dividing the original well having the first conductive type with the well having the second conductive type, so no extra mask for forming the second well is needed, and the manufacturing cost could be reduced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail.

The preferred exemplary embodiments of the present invention are illustrated in the accompanying drawings with numbered elements.

Figure 1:
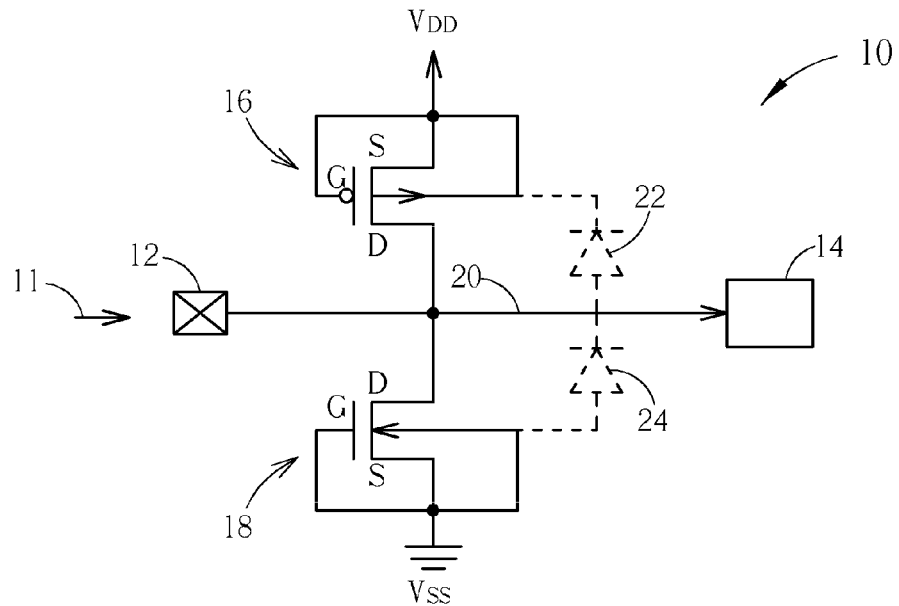
FIG. 1 is a schematic diagram illustrating a conventional electrostatic discharge (ESD) protection circuit used to protect an internal circuit.
Figure 2:
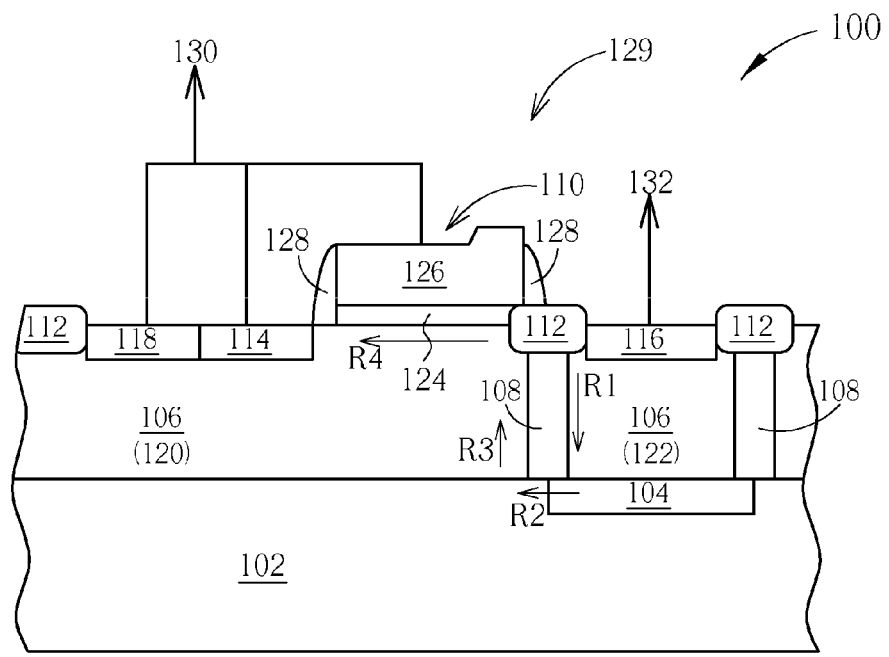
FIG. 2 is a schematic diagram illustrating an electrostatic discharge (ESD) protection device according to a preferred exemplary embodiment of the present invention.

The present invention provides an electrostatic discharge (ESD) protection device, which may be disposed between the signal input/output (I/O) pad and the internal circuit for discharging electrostatic current and protecting the internal circuit. Please refer to FIG. 2. FIG. 2 is a schematic diagram illustrating an electrostatic discharge (ESD) protection device according to a preferred exemplary embodiment of the present invention. As shown in FIG. 2, the ESD protection device 100 includes a semiconductor substrate 102 having a first conductive type, a buried layer 104 having a second conductive type, at least a well 106 having the first conductive type, at least a well 108 having the second conductive type, a gate structure 110, an isolation structure 112, a first doped region 114, a second doped region 116, and a third doped region 118. The first conductivity type could be P-type or N-type, and the second conductivity type would be the other one. In this exemplary embodiment, it is preferable that the first conductivity type is P-type and the second conductivity type is N-type, but not limited thereto. The semiconductor substrate 102 may be a substrate composed of GaAs, silicon on insulator (SOI) layer, epitaxial layer, SiGe layer or other semiconductor materials. The buried layer 104 is disposed in the semiconductor substrate 102 for insulation purposes, or, for example, to stop the current signal transferring downward into the semiconductor substrate 102 and avoid leakage.

The well 106 having the first conductive type is disposed in the semiconductor substrate 102 having the first conductive type. The well 106 is disposed on the buried layer 104 and preferably contacts the buried layer 104. In other words, the buried layer 104 having the second conductive type is disposed in the semiconductor substrate 102 under the well 106 having the first conductive type.

The well 108 having the second conductive type is disposed to divide the well 106 having the first conductive type into a second well 122 and at least a first well 120. In this exemplary embodiment, a depth of the well 108 is substantially equal to a depth of the well 106. Furthermore, the dopant types and the dopant concentration of the first well 120 are the same as the dopant types and the dopant concentration of the second well 122. The well 108 can also be disposed to divide the well 106 into a plurality of sub wells having the same depths. In other words, a depth of each of the sub wells, i.e. a depth of the first well 120 and a depth of the second well 122, is substantially equal to the depth of the well 106 having the first conductive type. It is appreciated that, the well 108 is disposed between the first well 120 and the second well 122, and the buried layer 104 disposed underneath the second well 122 extends horizontally to be located under a part of the well 108. The buried layer 104 having the second conductive type therefore simultaneously directly contacts the overall second well 122 and a part of the well 108 having the second conductive type. In other words, the buried layer 104 simultaneously directly contacts the second well 122 and a part of the well 108, and the buried layer 104 preferably does not contact the first well 120 to avoid to influence the breakdown voltage of the ESD protection device 100. In this exemplary embodiment, the well 108 having the second conductive type could be a ring-shaped well and surround the second well 122. A width of the cross-section of the second well 122 is smaller than a width of the cross-section of the buried layer 104, and the second well 122 could be totally disposed on the buried layer 104 without contacting the semiconductor substrate 102. Accordingly, the buried layer 104 and the well 108 may be disposed together to wrap the well 106 surrounded by the well 108, i.e. the second well 122. Therefore, the well 108 and the buried layer 104 are jointly used to isolate the first well 120 from the second well 122.

The gate structure 110 includes a gate dielectric layer 124, a gate conductive layer 126 and a spacer 128 disposed on the semiconductor substrate 102. The gate structure 110 does not totally overlap the buried layer 104. The materials of the gate structure 110 are known to those skilled in the art, for example, the gate conductive layer 126 of the gate structure 110 may be made of conductive material such as polysilicon, metal silicide or metal, and the details are omitted herein for brevity. A first doped region 114 having the second conductive type is disposed in the first well 120, a second doped region 116 having the second conductive type is disposed in the second well 122, and the first doped region 114 and the second doped region 116 are disposed at two sides of the gate structure 110. The isolation structure 112 made of dielectric materials may include field oxide layer or shallow trench isolation (STI). The isolation structure 112 is disposed between the gate structure 110 and the second doped region 116. In this exemplary embodiment, the isolation structure 112 preferably surrounds the second doped region 116. Furthermore, the isolation structure 112 covers a boundary between the first well 120 and the well 108 having the second conductive type, the disposition of the isolation structure 112 may increase the distance between the first doped region 114 and the second doped region 116 for buffering the high voltage signals between the first doped region 114 and the second doped region 116. Additionally, the gate structure 110 on the isolation structure 112 partially overlaps the isolation structure 112, therefore, the gate structure 110 may not directly contact the well 108, the second well 122 and the second doped region 116. In this exemplary embodiment, the first doped region 114 may serve as a source, the second doped region 116 may serve as a drain, the gate structure 110 may serve as a gate, and the isolation structure 112 may serve as a field oxide layer, which are jointly used to form the semiconductor element 129 such as a high-voltage metal-oxide semiconductor (HVNMOS), but not limited thereto.

The third doped region 118 having the first conductive type is disposed in the first well 120 of the well 106 having the first conductive type, and the third doped region 118 is disposed at a side of the gate structure 110 with respect to the second doped region 116. In other words, as the second doped region 116 is disposed at a side of the gate structure 110, the third doped region 118 and the first doped region 114 are disposed at another side of the gate structure 110 with respect to the second doped region 116. Furthermore, the third doped region 118 has the first conductive type, which is the same as the conductive type of the well 106, and the third doped region 118 may be used to adjust the electric potential of the well 106.

Figure 3:
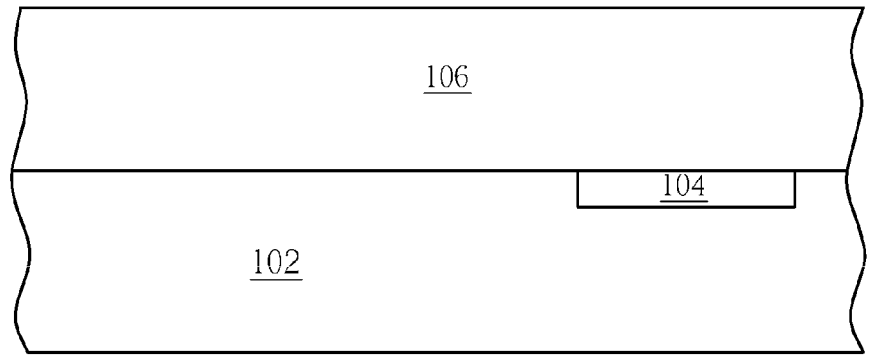
FIG. 3 through FIG. 6 illustrate a method of fabricating an electrostatic discharge (ESD) protection device according to a preferred exemplary embodiment of the present invention.

Please refer to FIG. 3 through FIG. 6. FIG. 3 through FIG. 6 illustrate a method of fabricating an electrostatic discharge (ESD) protection device according to a preferred exemplary embodiment of the present invention. The method of fabricating an ESD protection device includes the following steps. As shown in FIG. 3, the semiconductor substrate 102 having the first conductive type is provided, and an ion implantation process is performed to form the buried layer 104 having the second conductive type in the semiconductor substrate 102. The first conductivity type could be P-type or N-type, and the second conductivity type would be the other one. In this exemplary embodiment, it is preferable that the first conductivity type is P-type and the second conductivity type is N-type, but not limited thereto. In other words, the semiconductor substrate 102 may include a P-type substrate composed of GaAs, silicon on insulator (SOI) layer, epitaxial layer, SiGe layer or other semiconductor materials, and the buried layer 104 could be an N-type buried layer such as N+ buried layer. Subsequently, an epitaxial layer (not shown) can be further formed to thicken the semiconductor substrate 102, for example through performing a selective epitaxial growth (SEG) process to form the epitaxial layer on the buried layer 104. Then, an ion implantation process is performed to form the well 106 having the first conductive type in the epitaxial layer, i.e. the well 106 is formed in the semiconductor substrate 102 above the buried layer 104, and the well 106 could be a P-type well.

Figure 4:
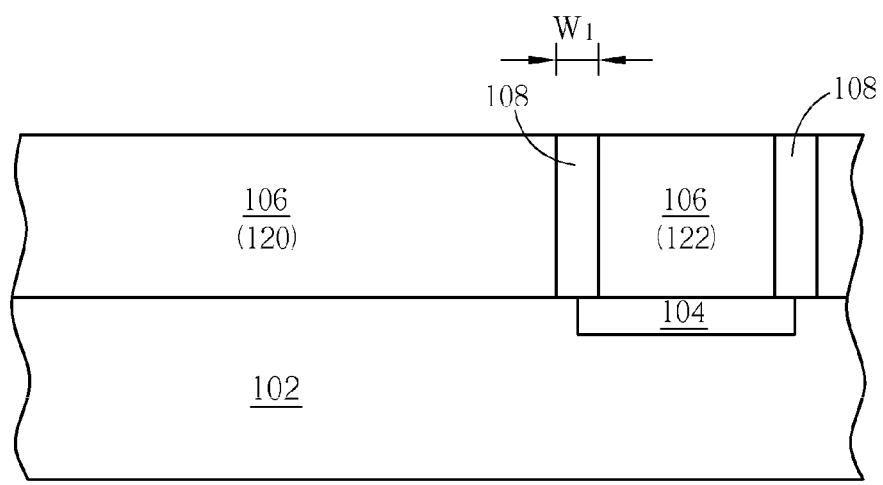

As shown in FIG. 4, an ion implantation process is performed to form at least a well 108 having the second conductive type in the well 106 having the first conductive type to divide the well 106 into at least a first well 120 and a second well 122. The number of the well 106 and the number of the well 108, and the number of the formed first well 120 and the number of the formed second well 122, are all not limited thereto. In this exemplary embodiment, the well 108 could be a ring-shaped well surrounding the second well 122. Furthermore, the depth of the well 108 is preferably substantially equal to the depth of the well 106, and the well 108 may directly contact the buried layer 104. For example, an N-type well (the well 108) could be formed in a P-type well (the well 106), the depth of the N-type well and the depth of the P-type well are the same, and the P-type well could be divided into a first P-type well (the first well 120) and a second P-type well (the second well 122) by the N-type well. In other words, the original P-type well can still be divided into a plurality of sub wells, such as the first P-type well and the second P-type well, without extra patterned masks, and the N-type well, the first P-type well and the second P-type well may have the same depth. It is appreciated that, the location and the occupied area of the well 108 may affect the distribution status of the first well 120 and the second well 122. As a cross-sectional width W1 of the well 108 increases, the distance between the first well 120 and the second well 122 increases as well, and the efficiency of the function of isolating the first well 120 from the second well 122 provided by the well 108 gets better, however, as the size of the later formed ESD protection device and the occupied area of the first well 120 are fixed, the increase of the cross-sectional width W1 may reduce the occupied area of second well 122, which may deteriorate the function of the later formed ESD protection device. Conversely, as the cross-sectional width W1 of the well 108 decreases, i.e. the occupied area of the well 108 decreases, the distance between the first well 120 and the second well 122 decreases, and the efficiency of the isolation of the first well 120 from the second well 122 provided by the well 108 may be degraded. However, as the size of the later formed ESD protection device and the occupied area of the first well 120 are fixed, the decrease of the cross-sectional width W1 may increase the occupied area of second well 122, which may enhance the function of the later formed ESD protection device. The well 108 is preferably disposed between the later formed gate structure and the later formed second doped region. As the width W1 of the well 108 is smaller than a determined value corresponding to the structure of the later formed ESD protection device, the electrostatic current may directly flow through the well 108 along the horizontal direction, and fail to flow through the second well 122 along the vertical direction, and the vertical path of discharging electrostatic current can therefore not be formed. The location and the occupied area of the well 108 can be adjusted according to the process requirements.

Figure 5:
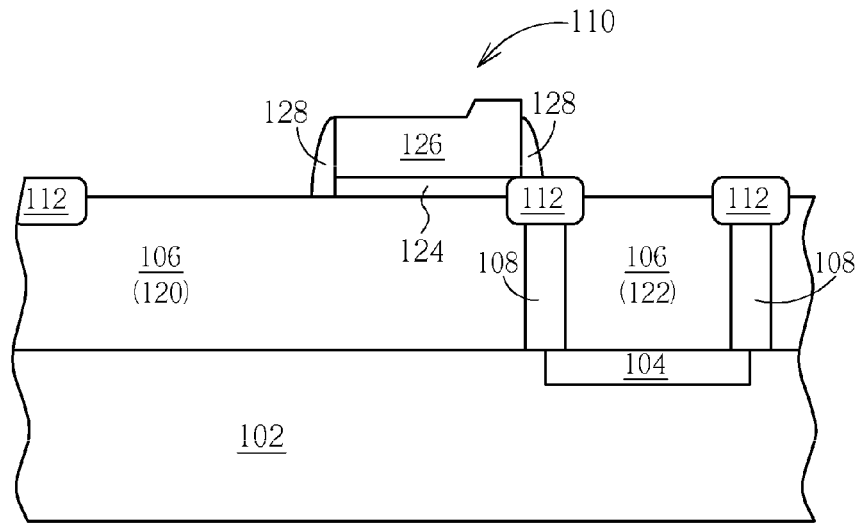

As shown in FIG. 5, at least an isolation structure 112 is formed in the semiconductor substrate 102, the gate structure 110 is formed on the semiconductor substrate 102, and the gate structure 110 partially overlaps the isolation structure 112. The isolation structure 112 made of dielectric materials may include a field oxide layer or a shallow trench isolation (STI). The isolation structure 112 preferably covers the boundary between the first well 120 and the well 108, and the boundary between the second well 122 and the well 108, but not limited thereto. The gate structure 110 may include the gate dielectric layer 124, the gate conductive layer 126 and the spacer 128. The processes of forming the isolation structure 112 and the gate structure 110 are known to those skilled in the art, and the details are omitted herein for brevity.

Figure 6:
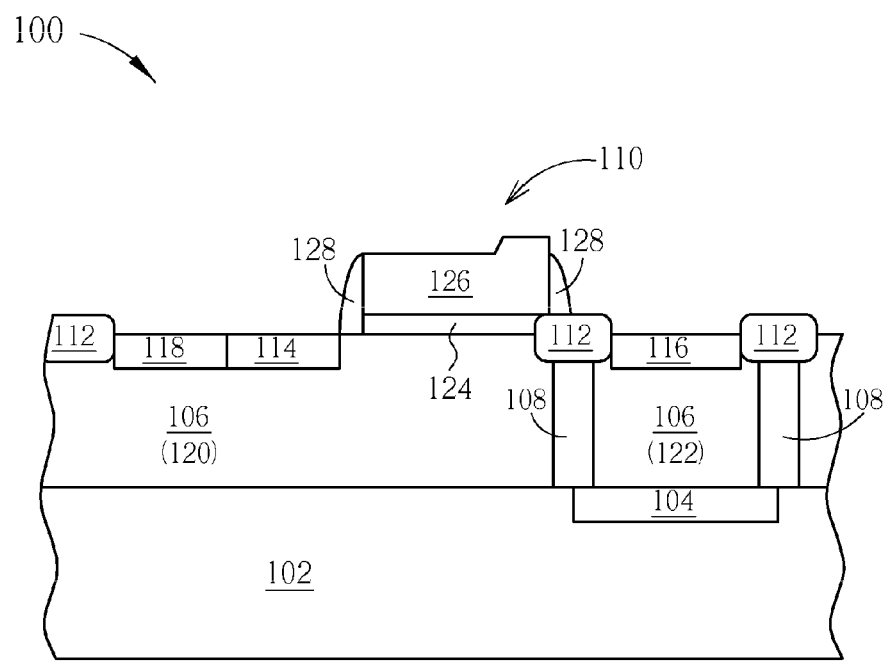

As shown in FIG. 6, the gate structure 110, the isolation structure 112 and a patterned photoresist layer (not shown) can be jointly used as a mask, and an ion implantation process is carried out to form the first doped region 114 having the second conductive type in the first well 120 and the second doped region 116 having the second conductive type in the second well 122, wherein the first doped region 114 and the second doped region 116 are disposed at two sides of the gate structure 110. Furthermore, a part of the second well 122 is preferably located between the second doped region 116 and the well 108, in order to isolate the second doped region 116 and the well 108 having the same conductive type from each other. Additionally, a lightly-doped region (not shown) can be selectively formed in the first well 120 between the gate dielectric layer 124 and the first doped region 114. In this exemplary embodiment, the buried layer 104, the well 108, the first doped region 114 and the second doped region 116 have the same conductive type such as the second conductive type, and the dopant concentration from heavily doped region to lightly doped region could be the first doped region 114 and the second doped region 116 (the dopant concentration of the first doped region 114 is the same as the dopant concentration of the second doped region 116), the buried layer 104 and the well 108. The first well 120 and the second well 122 are formed by dividing the well 106. Accordingly, the dopant type and the dopant concentration of the first well 120 are the same as the dopant type and the dopant concentration of the second well 122. Subsequently, an ion implantation process is further carried out to form the third doped region 118 having the first conductive type in the first well 120, and the third doped region 118 is disposed at a side of the gate structure 110 with respect to the second doped region 116. The dopant concentration of the third doped region 118 is preferably larger than the dopant concentration of the well 106. The sequence of forming the first doped region 114, the second doped region 116 and the third doped region 118 is not limited as illustrated above. Accordingly, the ESD protection device 100 is completed.

The flowing path of electrostatic current in the ESD protection device 100 is explained in the following paragraph. Please refer to FIG. 2 again. In this exemplary embodiment, the first doped region 114, the third doped region 118 and the gate structure 110 are electrically connected to a first power node 130, and the second doped region 116 is electrically connected to a second power node 132. The first power node 130 may include a low power node, and the second power node 132 may include a high power node. As the ESD event happens, a high voltage signal is provided by the second power node 132 to turn on the semiconductor element 129, and electrostatic current flows in through the second doped region 116 (which may serve as a drain). The isolation structure 112 can prevent the high voltage signal from penetrating through the gate dielectric layer 124 and from reaching the gate conductive layer 126, which may damage the semiconductor element 129. It is appreciated that the second well 122 of the present invention may simultaneously directly contact the second doped region 116 and the buried layer 104, furthermore, the second well 122 is totally formed on the buried layer 104 and surrounded by the well 108. This way, the disposition of the second well 122 makes the electrostatic current flows along a vertical path R1 in the second well 122, a path R2 in the buried layer 104 and the semiconductor substrate 102, and a path R3 on a side of the well 108 and in the first well 120 so as to reach the gate structure 110, in order to buffer the electrostatic current. Subsequently, the electrostatic current further flows along a path R4 in the channel region under the gate structure 110. Accordingly, the electrostatic current could be discharged through the first doped region 114 (which may serve as a source). In short, the ESD protection device 100 of the present invention may provide a path including the drain, the second well 122, the buried layer 104, the first well 120, the channel region and the source to discharge electrostatic current, while the conventional ESD protection device of the prior art only has a path including the drain, the well having a first conductive type, the channel region and the source to discharge electrostatic current along the horizontal direction. The disposition of the second well 122 can enlarge the path to discharge electrostatic current along the vertical direction, and the electrostatic current may not directly flow through the well 106 having the first conductive type and the channel region (path R4) along the horizontal direction to be discharged. Accordingly, the excess heat caused by electrostatic current can be prevented from burning out the ESD protection device 100, and the ESD endurance such as the second breakdown current (It2) of the ESD protection device 100 is increased.

Figure 7:
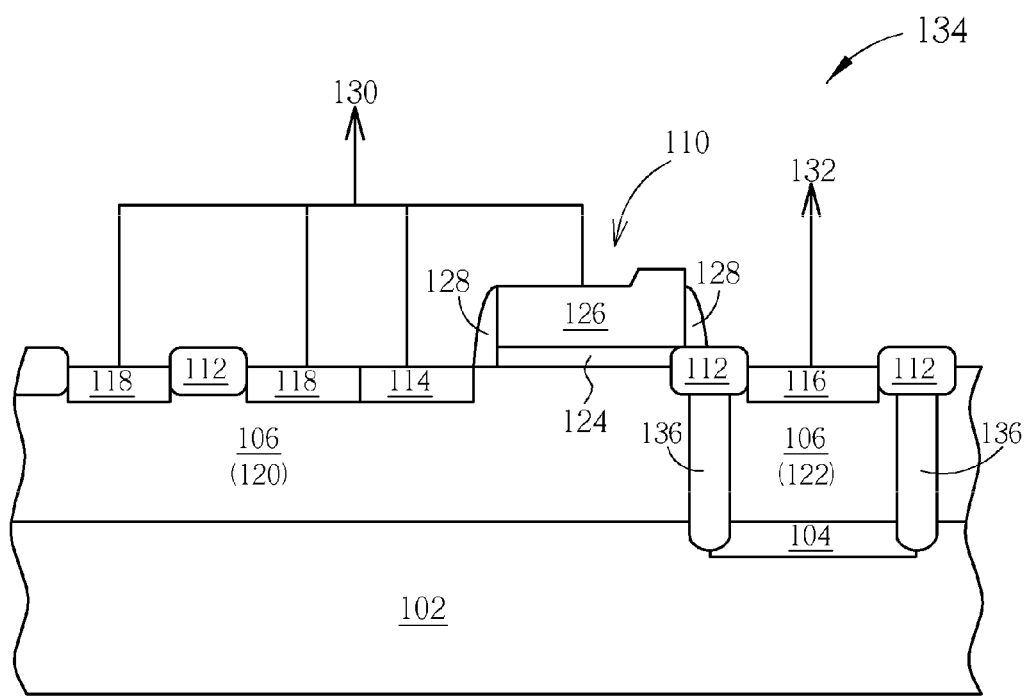
FIG. 7 is a schematic diagram illustrating an electrostatic discharge (ESD) protection device according to another preferred exemplary embodiment of the present invention.

Please refer to FIG. 7. FIG. 7 is a schematic diagram illustrating an electrostatic discharge (ESD) protection device according to another preferred exemplary embodiment of the present invention. As shown in FIG. 7, the ESD protection device 134 includes the semiconductor substrate 102 having the first conductive type, the buried layer 104 having the second conductive type, the well 106 having the first conductive type, a well 136 having the second conductive type, the gate structure 110, the isolation structure 112, the first doped region 114, the second doped region 116, and a plurality of third doped regions 118. The first doped region 114, the third doped regions 118 and the gate structure 110 are electrically connected to the first power node 130, and the second doped region 116 is electrically connected to the second power node 132. It is appreciated that, compared to the illustrated exemplary embodiment, the well 136 may extend downwards, and a part of the well 136 would be disposed in the buried layer 104. In other words, a depth of the well 136 having the second conductive type is substantially larger than the depth of the well 106 having the first conductive type. Furthermore, the number of the third doped region 118 is not limited to one; an increase in the number of the third doped regions 118 may be beneficial for adjusting the electric potential of the well 106, especially for the first well 120. In this exemplary embodiment, the materials of the elements, the dispositions of the elements, and the path of discharging electrostatic current are similar to those of the illustrated exemplary embodiment, forepart from the well 136 and the number of the third doped regions 118. The similarities are therefore omitted herein for brevity. In other exemplary embodiments, the gate structure 110, the first doped region 114, the third doped region 118 could also be further disposed at another side of the second doped region 116, and the center line of the second doped region 116 could be the axis of symmetry.

In conclusion, the second well is disposed under the doped region which may serve as a drain, and the electrostatic current can be discharged through the drain doped region, the second well and the buried layer along the vertical direction. In other words, the electrostatic current could be discharged not only through the channel region along the horizontal direction, but also through the second well and the buried layer along the vertical direction. Accordingly, the discharging path of electrostatic current can be increased, the excess heat caused by electrostatic current can be prevented from burning out the ESD protection device, and the ESD endurance of the ESD protection device is increased. Moreover, the second well is formed by dividing the original well having the first conductive type with the well having the second conductive type, so that no extra mask is needed to form the second well, and the manufacturing cost could be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection device, comprising:
   a well having a first conductive type disposed in a semiconductor substrate having the first conductive type;
   a buried layer having a second conductive type disposed in the semiconductor substrate under the well having the first conductive type; and
   a well having a second conductive type disposed to divide the well having the first conductive type into a first well and a second well, wherein the first well does not contact the buried layer, both of the well having the second conductive type and the second well directly contact the buried layer, and the well having the second conductive type and the buried layer are jointly used to isolate the first well from the second well.

2. The ESD protection device according to claim 1, wherein a depth of the well having the second conductive type is substantially equal to a depth of the well having the first conductive type.

3. The ESD protection device according to claim 1, wherein a depth of the well having the second conductive type is substantially larger than a depth of the well having the first conductive type.

4. The ESD protection device according to claim 1, wherein both a depth of the first well and a depth of the second well are equal to a depth of the well having the first conductive type.

5. The ESD protection device according to claim 1, wherein the buried layer contacts the well having the second conductive type.

6. The ESD protection device according to claim 1, wherein a width of a cross-section of the second well is smaller than a width of a cross-section of the buried layer.

7. The ESD protection device according to claim 1, wherein the second well are totally disposed on the buried layer.

8. The ESD protection device according to claim 1, wherein the first conductivity type is P-type and the second conductivity type is N-type.

9. The ESD protection device according to claim 1, wherein the well having the second conductive type comprises a ring-shaped well, and the well having the second conductive type surrounds the second well.

10. The ESD protection device according to claim 1, further comprising a gate structure disposed on the semiconductor substrate, wherein the gate structure and the buried layer do not totally overlap with each other.

11. The ESD protection device according to claim 10, further comprising:
- a first doped region having the second conductive type disposed in the first well;
- a second doped region having the second conductive type disposed in the second well, wherein the first doped region and the second doped region are disposed at two sides of the gate structure; and
- a third doped region having the first conductive type disposed in the first well, wherein the third doped region is disposed at a side of the gate structure with respect to the second doped region.

12. The ESD protection device according to claim 11, wherein a part of the second well is between the second doped region disposed on a surface of the second well and the well having the second conductive type.

13. The ESD protection device according to claim 11, wherein the first doped region, the third doped region and the gate structure are electrically connected to a first power node.

14. The ESD protection device according to claim 11, wherein the second doped region is electrically connected to a second power node.

* * * * *